(12) United States Patent
Yamae et al.

(10) Patent No.: US 8,772,761 B2
(45) Date of Patent: Jul. 8, 2014

(54) LIGHT EMITTING DEVICE

(75) Inventors: Kazuyuki Yamae, Ikoma (JP);
Kenichiro Tanaka, Neyagawa (JP)

(73) Assignee: Panasonic Corporation, Kadoma-Shi (JP)

( * ) Notice: Subject to any disclaimer, the term of this patent is extended or adjusted under 35 U.S.C. 154(b) by 1 day.

(21) Appl. No.: 13/203,072

(22) PCT Filed: Feb. 22, 2010

(86) PCT No.: PCT/JP2010/052620
§ 371 (c)(1),
(2), (4) Date: Nov. 3, 2011

(87) PCT Pub. No.: WO2010/098279
PCT Pub. Date: Sep. 2, 2010

(65) Prior Publication Data
US 2012/0049170 A1     Mar. 1, 2012

(30) Foreign Application Priority Data

Feb. 24, 2009   (JP) .................................. 2009-041524

(51) Int. Cl.
*H01L 35/24* (2006.01)
(52) U.S. Cl.
USPC ..................................... 257/40; 257/E51.001
(58) Field of Classification Search
USPC ....... 257/40, 79–103, E51.001; 359/558–576
See application file for complete search history.

(56) References Cited

U.S. PATENT DOCUMENTS

| 6,476,550 | B1 * | 11/2002 | Oda et al. ...................... 313/504 |
| 6,900,457 | B2 | 5/2005 | Toguchi et al. |
| 7,094,122 | B2 | 8/2006 | Toguchi et al. |
| 7,160,744 | B2 * | 1/2007 | Park et al. ........................ 438/29 |
| 2004/0056592 | A1 | 3/2004 | Noguchi |
| 2005/0094537 | A1 | 5/2005 | Ikenaka et al. |
| 2007/0085100 | A1 * | 4/2007 | Diana et al. ...................... 257/98 |
| 2007/0120136 | A1 * | 5/2007 | Noda et al. ...................... 257/98 |
| 2009/0066241 | A1 | 3/2009 | Yokoyama |

FOREIGN PATENT DOCUMENTS

| CN | 1867976 A | 11/2006 |
| JP | 2002-189113 A | 7/2002 |
| JP | 2003-115377 A | 4/2003 |
| JP | 2004-119286 A | 4/2004 |

(Continued)

OTHER PUBLICATIONS

Yoel Arieli et al., "Design of diffractive optical elements for multiple wavelengths," Applied Optics, Sep. 10, 1998, vol. 37, No. 26, pp. 6174-6177.

(Continued)

*Primary Examiner* — Anthony Ho
(74) *Attorney, Agent, or Firm* — Edwards Wildman Palmer LLP; James E. Armstrong, IV; George N. Chaclas

(57) ABSTRACT

The light emitting device includes an organic electroluminescent element (20) and a diffractive optical element (30). The organic electroluminescent element (20) includes an anode layer (21), a cathode layer (22), and plural light emitting layers (231 and 232) interposed between the anode layer (21) and the cathode layer (22) and configured to emit light rays with different wavelengths. The diffractive optical element (30) is positioned in paths of light rays emitted from the organic electroluminescent element (20). The diffractive optical element (30) is designed to have different grating patterns (311 and 312) diffracting the light rays respectively emitted from the light emitting layers (231 and 232) for reducing chromatic aberration.

24 Claims, 5 Drawing Sheets

(56) References Cited

FOREIGN PATENT DOCUMENTS

| | | |
|---|---|---|
| JP | 2004-119286 A | 4/2004 |
| JP | 2004-311419 A | 11/2004 |
| JP | 2006-058844 A | 3/2006 |
| JP | 2006-060144 A | 3/2006 |
| JP | 2006-083148 A | 3/2006 |
| JP | 2007-114266 A | 5/2007 |
| JP | 2008-084663 | 4/2008 |
| JP | 2008-091069 | 4/2008 |
| JP | 2008-105226 A | 5/2008 |
| JP | 2008-299084 A | 12/2008 |
| JP | 2009-272059 A | 11/2009 |
| WO | WO-2008/032557 A1 | 3/2008 |

OTHER PUBLICATIONS

International Search Repot dated May 25, 2010, issued for PCT/JP2010/052620.

Japanese Office Action in corresponding Japanese Patent Application No. 2012-227684 dated Jun. 25, 2013.

Korean Office Action in corresponding KP 10-2011-7021977, dated Mar. 9, 2013.

Office Action received in Japanese Application No. JP 2012-227685 on Sep. 3, 2013.

\* cited by examiner

LIGHT EMITTING DEVICE

TECHNICAL FIELD

The present invention is directed to light emitting devices, and particularly to a light emitting device employing an organic electroluminescence element.

BACKGROUND ART

Document 1 (JP 2004-119286) discloses a light emitting device. This light emitting device includes a glass substrate, an ITO transparent electrode (anode electrode), a light emitting layer configured to emit light by means of EL, a back electrode (cathode electrode), and a diffractive optical element. In order to improve light extraction efficiency of the diffractive optical element, the diffractive optical element is provided on its surface with protrusions or grooves for preventing total reflection of the light emitted from the light emitting layer. For the purpose of suppressing an interference pattern caused by the diffractive optical element, the light emitting device is configured to emit white light with a discrete spectrum.

In Document 1, the white light emitted from the light emitting layer is deflected by the ITO transparent electrode, the glass electrode, and the diffractive optical element, when the white light comes into the ITO transparent electrode, the glass electrode, and the diffractive optical element, respectively. Therefore, the light emitting device of Document 1 suffers from chromatic aberration.

DISCLOSURE OF INVENTION

In view of the above insufficiency, the present invention has been aimed to propose a light emitting device capable of reducing chromatic aberration and improving light output.

The light emitting device in accordance with the present invention includes an organic electroluminescence element configured to emit light rays of different wavelengths, and a diffractive optical element located in paths of the light rays emitted from the organic electroluminescence element. The diffractive optical element is designed to have different grating patterns diffracting the light rays emitted from the organic electroluminescence element for reducing chromatic aberration.

In a preferred embodiment, the organic electroluminescence element includes an anode layer, a cathode layer, light emitting layers, and a substrate. The light emitting layers are interposed between the anode layer and the cathode layer. The light emitting layers are configured to emit the light rays of the different wavelengths, respectively. The substrate has a first surface and a second surface. The substrate is located in the paths of the light rays respectively emitted from the light emitting layers. The substrate has transparency for the light rays respectively emitted from the light emitting layers. The anode layer, the cathode layer, the plural light emitting layers are stacked on the first surface. At least one of the grating patterns is defined by the second surface having grooves periodically arranged thereon.

Alternatively, in a preferred aspect, the organic electroluminescence element includes an anode layer, a cathode layer, light emitting layers, and a substrate. The light emitting layers are interposed between the anode layer and the cathode layer. The light emitting layers are configured to emit the light rays of the different wavelengths, respectively. The substrate is located in the path of the light rays respectively emitted from the light emitting layers. The substrate has transparency for the light rays respectively emitted from the light emitting layers. At least one of the grating patterns is defined by regions which are formed inside of the substrate at predetermined intervals and have a different refractive index from that of the substrate.

BEST MODE FOR CARRYING OUT THE INVENTION

First Embodiment

Figure 1:
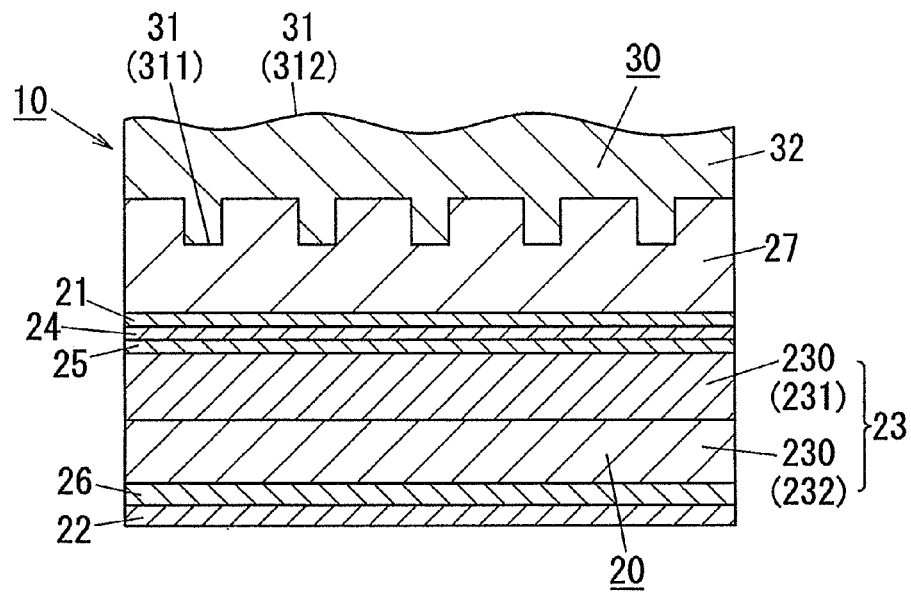
FIG. 1 is a schematic cross sectional diagram illustrating the light emitting device of the first embodiment.

The light emitting device 10 of the present embodiment, as shown in FIG. 1, includes an organic electroluminescence element (hereinafter, referred to as "organic EL element") 20, and a diffractive optical element 30.

The organic EL element 20 includes, an anode layer 21, a cathode layer 22, and an organic light emitting layer 23 interposed between the anode layer 21 and the cathode layer 22. The organic EL element 20 further include a hole injecting layer 24, a hole transporting layer 25, and an electron transporting layer 26.

The organic EL element 20 further includes a substrate 27. The substrate 27 is used for forming the anode layer 21, the cathode layer 22, and the light emitting layer 23, for example. In the present embodiment, the anode layer 21, the cathode layer 22, the organic light emitting layer 23, the hole injecting layer 24, the hole transporting layer 25, and the electron transporting layer 26 are stacked on a first surface (lower surface, in FIG. 1) of the substrate 27.

The diffractive optical element 30 is located in paths of the light rays emitted from the organic EL element 20. The diffractive optical element 30 is placed over a light emission surface side (upper surface side, in FIG. 1). The light emission surface is a surface of the organic EL element through which the light rays are emitted. The diffractive optical element 30 functions as a chromatic aberration-free collective lens (achromatizing lens).

The organic light emitting layer 23 includes two light emitting layers 230. The light emitting layer 230 (231) close to the substrate 27 (upper side, in FIG. 1) is configured to emit a yellow light ray. The light emitting layer 230 (232) far from the substrate 27 (lower side, in FIG. 1) is configured to emit a blue light ray. The two light emitting layers 231 and 232 are configured to emit light rays having different wavelengths (dominant emission wavelengths). Hereinafter, if necessary, the light emitting layer 231 is referred to as a yellow light emitting layer, and the light emitting layer 232 is referred to as a blue light emitting layer.

The diffractive optical element 30 includes a transparent member 32 formed on a second surface (upper surface, in FIG. 1) of the substrate 27. In the present embodiment, the diffractive optical element 30 is defined by the substrate 27 and the transparent member 32 to include plural different grating patterns (diffractive optical portions) 31 (311, 312) which are designed to diffract the light rays respectively emitted from the light emitting layers for reducing chromatic aberration. In the present invention, the term "different grating patterns" means "grating patterns which have diffraction angles different from each other in relation to the incident light ray of the same wavelength".

In the present embodiment, the grating pattern 311 is defined by a serrate surface formed in the second surface of the substrate 27. The grating pattern 312 is defined by a waved surface formed in an opposite surface (upper surface, in FIG. 1) of the transparent member 32 from the substrate 27.

In other words, the diffractive optical element 30 is designed to have the plural grating patterns 31 which diffract the light rays (yellow and blue light rays) respectively emitted from the light emitting layers 230 for reducing the chromatic aberration (especially, the axial chromatic aberration), i.e., coinciding the focal length of the light rays respectively emitted from the plural light emitting layers 230. That is, the grating pattern 311 has the diffraction angle which is different from that of the grating pattern 312 with regard to the light rays (yellow light ray and blue light ray) emitted respectively from the light emitting layers 230. Thus, the light rays (yellow and blue light rays) from the light emitting layers 230 are diffracted respectively by the grating patterns 311 and 312 at different diffraction angles to coincide the focal length of the light rays with each other.

The substrate 27 has enough strength for supporting the layers 21 to 26. In addition, the substrate 27 is necessitated to have heat resistance depending on a method of preparing (depositing) the layers 21 to 26. In the present embodiment, the substrate 27 is placed over the light emission surface (upper surface, in FIG. 1) of the organic light emitting layer 23. In brief, the substrate 27 is located in the paths of the light rays respectively emitted from the light emitting layers 230. The substrate 27 is made of a transparent material for enabling the light ray emitted from the organic light emitting layer 23 to pass through the substrate 27. Preferably, the substrate 27 is made of a material having high optical transmittance in relation to the light ray emitted from the organic light emitting layer 23. For example, the material of the substrate 27 is selected from a glass material (e.g., a borosilicate crown optical glass) and a transparent plastic material.

The anode layer 21 is preferred to be configured to inject holes into the organic light emitting layer 23 with high efficiency. In the present embodiment, the anode layer 21 is placed over the light emission surface (upper surface, in FIG. 1) of the organic light emitting layer 23. In brief, the anode layer 21 is located in the paths of the light rays respectively emitted from the light emitting layers 230. Therefore, in order to enable the light ray emitted from the organic light emitting layer 23 to pass through the anode layer 21, the anode layer 21 is made of a material having high optical transmittance in relation to the light ray emitted from the organic light emitting layer 23. In the present embodiment, the organic EL element 20 is a white light source. The material of the anode layer 21 is preferred to be an indium tin oxide (ITO). For example, the material of the anode layer 21 is selected from nickel, gold, silver, platinum, palladium, an alloy thereof, and a transparent conductive film (e.g., an indium zinc oxide (IZO) and an antimony tin oxide).

The cathode layer 22 is preferred to be configured to inject electrons for recombining with holes into the organic light emitting layer 23 with high efficiency. In the present embodiment, the cathode layer 22 is made of a material reflecting the light ray emitted from the organic light emitting layer 23 such that the light ray is emitted via only a surface (upper surface, in FIG. 1) of the organic light emitting layer 23. In the present embodiment, the organic EL element 20 is the white light source. Therefore, the material of the cathode layer 22 is preferred to be selected from aluminum and a magnesium-silver alloy, which have high reflectance for visible light. For example, the cathode layer 22 is made of such as magnesium, a magnesium-indium alloy, a magnesium-aluminum alloy, and an aluminum-lithium alloy.

The organic light emitting layer 23 is defined as a laminated film including the plural light emitting layers 230 having the different dominant emission wavelengths. In the instance shown in FIG. 1, the organic light emitting layer 23 includes the two light emitting layers 231 and 232. The colors of the light rays respectively emitted from the two light emitting layers 231 and 232 are complementary colors. In brief, the organic EL element 20 is configured to emit a white light. In the present embodiment, the light emitting layer 231 is configured to emit a yellow light ray. The light emitting layer 231 is a layer made of a triphenyldiamine derivative doped with a tetracene derivative. The light emitting layer 232 is configured to emit a blue light ray. The light emitting layer 232 is a layer made of bis(2-methyl-8-quinolinolato, para-phenylephenolato)aluminium (BAlq3) doped with perylene.

Figure 5:
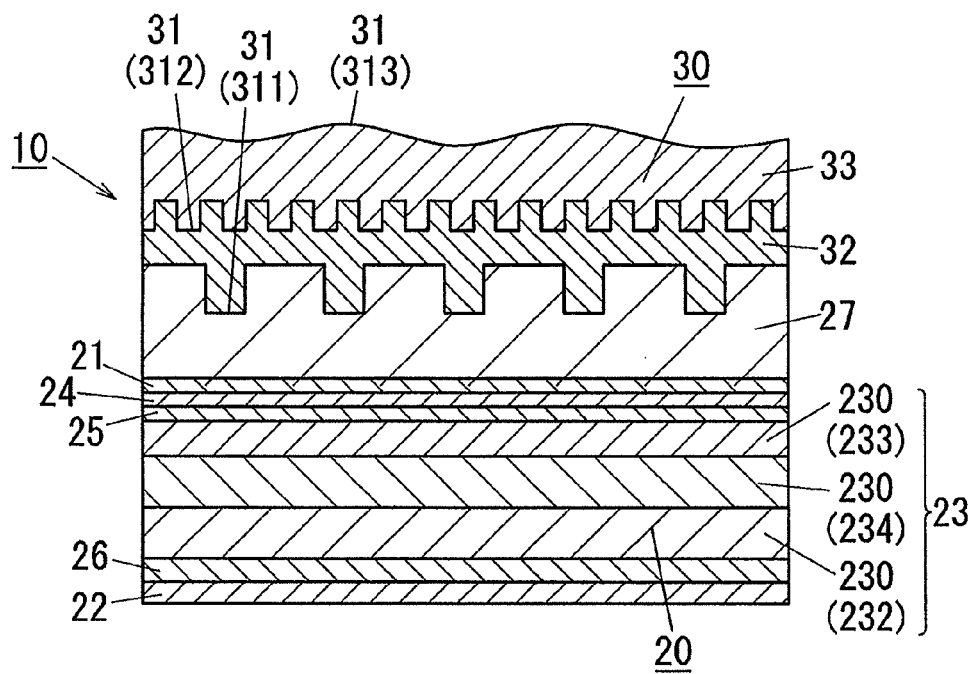
FIG. 5 is a schematic cross sectional diagram illustrating a primary part of the light emitting device of the second modification of the first embodiment.

FIG. 5 shows the light emitting device 10 of a modification of the present embodiment. In the light emitting device 10, the organic light emitting layer 23 may include the three light emitting layers 230 (232, 233, and 234). The light emitting layer 233 is configured to emit a red light ray. The light emitting layer 233 is a layer made of tris(8-hydroxyquinolinato)aluminium (hereinafter, referred to as "Alq3") doped with [2-[2-[4-(dimethylamino)phenyl]ethynyl]-6-methyl-4H-ylidene]-propanepropan dinitrile (DCM dye). The light emitting layer 234 is configured to emit a green light ray. The light emitting layer (green light emitting layer) 234 is a layer made of Alq3.

When the two or more light emitting layers 230 having the different dominant wavelengths are stacked, the light emitting layer 230 emitting light having relatively long wavelength is preferred to be closer to the light emission surface than the light emitting layer 230 emitting light having relatively short wavelength. According to this manner, it is possible to improve light extraction efficiency. In the instance shown in FIG. 1, the yellow light emitting layer 231 is closer to the light emission surface than the blue light emitting layer 232. In the instance shown in FIG. 5, the red light emitting layer 233 is closer to the light emission surface than the green light emitting layer 234, and the green light emitting layer 234 is closer to the light emission surface than the blue light emitting layer 233.

The hole injecting layer 24 is configured to reduce an energy barrier for hole injection. The hole injecting layer 24 is made of a polythiophene derivative, for example.

The hole transporting layer 25 is configured to have a proper ionization potential and enhance hole mobility in order to transport holes to the organic light emitting layer 23 efficiently to decrease a driving voltage of the organic EL element 20. In addition, the hole transporting layer 25 is configured to have low electron affinity in order to prevent a leakage of excess electrons from the organic light emitting layer 23. A material of the hole transporting layer 25 may be selected from bis[N-(1-naphthyl)-N-phenyl]benzidine (α-NDP) and N,N-diphenyl-N,N-bis(3-methylphenyl)1,1'-biphenyl-4,4-diamine (TPD).

The electron transporting layer 26 is configured to transport electrons to the organic light emitting layer 23 efficiently and to prevent holes from flowing into the electron transporting layer 26 from the organic light emitting layer 23. For example, the electron transporting layer 26 is made of lithium fluoride (LiF).

The anode layer 21, the organic light emitting layer 23, and the cathode layer 22 are formed by use of a vacuum deposition method, for example. Besides, the hole injecting layer 24, the hole transporting layer 25, and the electron transporting layer 26 are not necessarily formed.

The diffractive optical element (DOE) 30 includes the two grating patterns (diffractive optical portions) 31 (311 and 312) disposed on the light emission side of the organic EL element 20. The grating patterns 311 and 312 are formed into predetermined shapes in order to reduce the chromatic aberration between the light rays of different dominant wavelengths emitted from the organic light emitting layer 23. Thus, the diffractive optical element 30 reduces the chromatic aberration (the wavelength dependency of light) based on the wave nature of light.

The diffractive optical element 30 is made of a glass material, and representative examples of the glass material are a synthetic silica glass (having a refractive index n of 1.46 for light having a wavelength of about 550 nm) and a borosilicate crown optical glass (having a refractive index n of 1.52 for light having a wavelength of about 550 nm). The material of the diffractive optical element 30 is selected from various materials depending on the configuration of the grating pattern 31. In the light emitting device 10 shown in FIG. 1, the diffractive optical element 30 is defined by the substrate 27 and the transparent member 32. The transparent member 32 is a glass film made of one selected from a synthetic silica glass and a borosilicate crown optical glass, for example.

The grating pattern 311 diffracts the light rays respectively emitted from the light emitting layers 231 and 232 at the diffraction angle different from that of the grating pattern 312. Consequently, spatial phase distribution of each of the light rays emitted from the light emitting layers 231 and 232 becomes uniform (the focal lengths respectively regarding the light rays emitted from the light emitting layers 231 and 232 coincide with each other). As a result, the chromatic aberration can be reduced.

The light emitting device 10 shown in FIG. 5 has the three light rays having the different wavelengths. In this instance, the diffractive optical element 30 requires the three grating patterns (the first grating pattern 311, the second grating pattern 312, and the third grating pattern 313). In the light emitting device 10 shown in FIG. 5, the diffractive optical element 30 is defined by the substrate 27, the transparent member 32, and a transparent member 33. Each of the transparent members 32 and 33 is a glass film made of one selected from a synthetic silica glass and a borosilicate crown optical glass, for example.

The diffractive optical element 30 includes the three grating patterns depending on the three light rays having the different wavelengths, thereby reducing the chromatic aberration. In theory, when the light rays respectively from the light emitting layers 232, 233, and 234 are emitted along the same direction, color unevenness does not occur. The configuration of the diffractive optical element 30 is disclosed in a reference document 1 (Yoel Arieli, et al, "Design of diffractive optical elements for multiple wavelengths", APPLIED OPTICS/Vol. 37, No. 26/10 Sep. 1998, p. 6174-6177).

Figure 2:
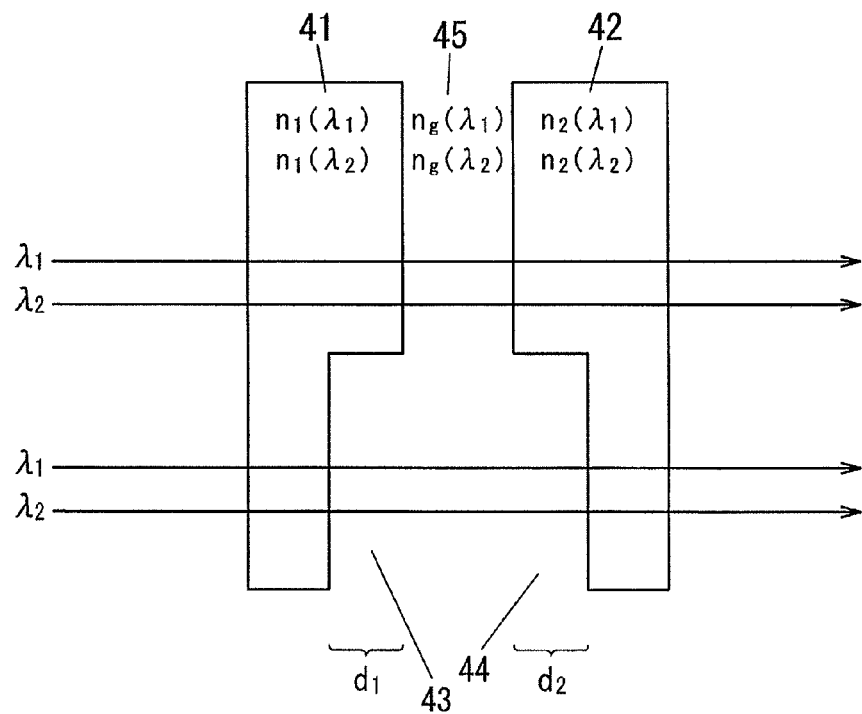
FIG. 2 is an explanatory diagram illustrating a method for designing the diffractive optical element.

The reference document 1 discloses, as shown in FIG. 2, an instance including two diffractive optical elements (first diffractive optical element 41 and second diffractive optical element 42). FIG. 2 illustrates one pixel of each of the diffractive optical elements 41 and 42. The first diffractive optical element 41 is provided with a recessed portion 43 in a surface facing the second diffractive optical element 42. The second diffractive optical element 42 is provided with a recessed portion 44 in a surface facing the first diffractive optical element 41.

In this instance, the first diffractive optical element 41 has a refractive index $n_1(\lambda_1)$ for light of a dominant wavelength $\lambda_1$, and a refractive index $n_1(\lambda_2)$ for light of a dominant wavelength $\lambda_2$. The second diffractive optical element 42 has a refractive index $n_2(\lambda_1)$ for the light of the dominant wavelength $\lambda_1$, and a refractive index $n_2(\lambda_2)$ for the light of the dominant wavelength $\lambda_2$. There is a medium between the first diffractive optical element 41 and the second diffractive optical element 42, and the medium has a refractive index $n_g(\lambda_1)$ for the light of the dominant wavelength $\lambda_1$, and a refractive index $n_g(\lambda_2)$ for the light of the dominant wavelength $\lambda_2$. In the following, $\phi_1$ denotes a phase delay caused by propagation of the light of the dominant wavelength $\lambda_1$ through the first diffractive optical element 41, the medium 45, and the second diffractive optical element 42, and $\phi_2$ denotes a phase delay caused by propagation of the light of the dominant wavelength $\lambda_2$ through the first diffractive optical element 41, the medium 45, and the second diffractive optical element 42, and $m_1$ and $m_2$ denote any integers, and $d_1$ denotes a depth of the recessed portion 43, and $d_2$ denotes a depth of the recessed portion 44.

When the depth $d_1$ of the recessed portion 43 satisfies the following formula (1) and the depth $d_2$ of the recessed portion 44 satisfies the following formula (2), the chromatic aberration can be reduced.

[FORMULA 1]

$$d_1 = \frac{[n_2(\lambda_2) - n_g(\lambda_2)]\frac{\lambda_1(\phi_1 + m_1 2\pi)}{2\pi} - [n_2(\lambda_1) - n_g(\lambda_1)]\frac{\lambda_2(\phi_2 + m_2 2\pi)}{2\pi}}{[n_1(\lambda_1) - n_g(\lambda_1)][n_2(\lambda_2) - n_g(\lambda_2)] - [n_1(\lambda_2) - n_g(\lambda_2)][n_2(\lambda_1) - n_g(\lambda_1)]} \quad (1)$$

[FORMULA 2]

$$d_2 = \frac{[n_1(\lambda_2) - n_g(\lambda_2)]\frac{\lambda_1(\phi_1 + m_1 2\pi)}{2\pi} - [n_1(\lambda_1) - n_g(\lambda_1)]\frac{\lambda_2(\phi_2 + m_2 2\pi)}{2\pi}}{[n_1(\lambda_1) - n_g(\lambda_1)][n_2(\lambda_2) - n_g(\lambda_2)] - [n_1(\lambda_2) - n_g(\lambda_2)][n_2(\lambda_1) - n_g(\lambda_1)]} \quad (2)$$

The reference document 1 discloses a method of designing diffractive optical elements (e.g., the diffractive optical element including three or more diffractive optical portions, and the diffractive optical element for three or more light rays having different wavelengths). Therefore, the depth $d_1$ of the recessed portion 43 of the diffractive optical element 41 and the depth $d_2$ of the recessed portion 44 of the diffractive optical element 42 can be determined by use of formulae disclosed in the reference document 1 and commercially available optical simulation software. For example, the optical simulation software is electromagnetic optical analysis software using Iterative Fourier Transform Algorithm (IFTA) method. Regarding a lateral length of one pixel, lateral dimensions of the recessed portions 43 and 44 can be considered. When Λ denotes a pitch per one pixel, and "N" denotes a level (the number of steps), and λ denotes the dominant wavelength of the light, and $\theta_1$ denotes the diffraction angle of the first order diffracted light, a relation of $\Lambda/N=\lambda \sin\theta_1$ is fulfilled. The lateral dimension of each of the recessed portions 43 and 44 is determined depending on the dominant wavelengths of the light rays respectively emitted from the light emitting layers 231 and 232. Using the software employing the IFTA method for determination of the design of the diffractive optical element enables calculating Λ by means of inputting the number of steps "N", the diffraction angle $\theta_1$ of the first order diffracted light, and the dominant wavelength λ of the light. In more detail, the calculation can be done by use of the optical simulation software after determination of (1) field setting, (2) determination of parameters such as input light source and ideal output.

The present embodiment employs, instead of the plural diffractive optical elements 41 and 42, the single diffractive optical element 30 including the plural grating patterns 311 and 312. The diffractive optical element 30 can be designed in a similar fashion as disclosed in the reference document 1. In brief, in (1) field setting, distances between the grating pattern (first grating pattern) 311 and each light emitting layer 230 of the organic EL element 20 used as the light source, distances between the grating pattern (second grating pattern) 312 and each light emitting layer 230, and a sampling interval (varied with Λ) are determined. In (2) determination of parameters such as input light source and ideal output, parameters are appropriately determined. The parameters are such as the dominant wavelengths for the light rays respectively emitted from the light emitting layers 230, light intensity (phase) distributions of the respective light emitting layers 230, dimensions (dimensions of region in which the plural recessed portions are formed) of the respective grating patterns 31, the number of steps "N", a material (refractive index), size of an outputting area (irradiation area), a location of outputting area (irradiation area), and an output intensity (phase) distribution for reducing the chromatic aberration. When the optical simulation software is executed after the parameters are inputted, optimization is performed based on the ITFA method. Thereby, depth profiles in relation to the recessed portions of the grating patterns 31, diffraction efficiency, a color distribution of the irradiation area are obtained. The diffractive optical element 30 designed in the above mentioned manner can reduce light extraction loss which is caused by total reflection at an interface between the diffractive optical element 30 and air layer. Therefore, it is possible to improve the light extraction efficiency.

Figure 3:
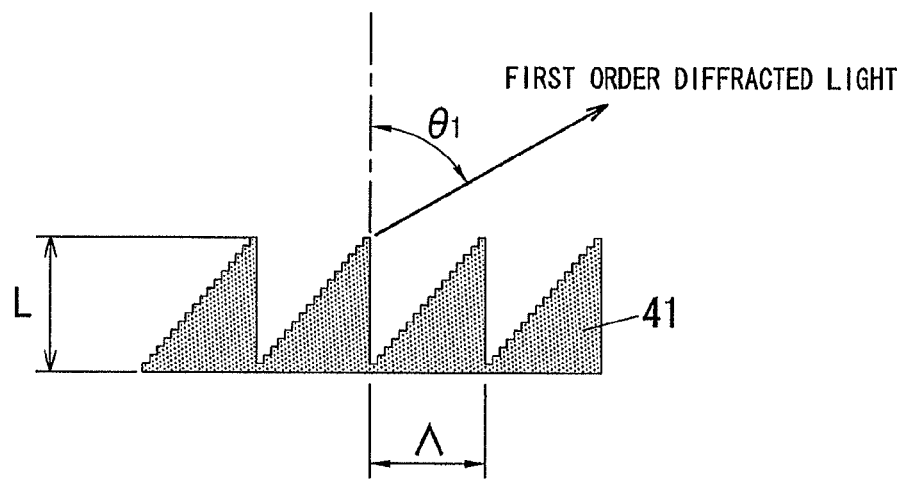
FIG. 3 is a schematic cross sectional diagram illustrating a primary part of the light emitting device of the first modification of the first embodiment.

The grating pattern 31 may have a configuration which is similar to that of the diffractive optical element 41 shown in FIG. 3. Regarding a cross sectional view, the diffractive optical element 41 is formed into a serration shape. The cross sectional shape of the diffractive optical element 30 shown in FIG. 3 is a stepped shape with 16 levels. With this instance, the first order diffraction efficiency can be improved. When the pitch per one pixel is Λ, and the depth is L, and the dominant wavelength of the light is λ, and the refractive index of the material of the diffractive optical element 41 is $n_1$, the depth L is determined by the following formula (3).

[FORMULA 3]

$$L = \frac{15\lambda}{16(n_1-1)} \quad (3)$$

The pitch Λ is expressed by the following formula (4), wherein "N" denotes the level (the number of steps: generally expressed as $2^n$), and $\theta_1$ denotes the diffraction angle.

[FORMULA 4]

$$\Lambda = N \times \lambda \times \sin\theta_1 \quad (4)$$

In order to obtain sufficient diffraction effect, Λ is preferred to be enough greater than λ. Thus, a relation of $N\sin\theta_1 \gg 1$ is necessitated to be satisfied. However, when the diffractive optical element 4 has a continuous shape where "N" is considered to be infinity, this diffractive optical element 4 provides a phenomenon which is different from that provided by the diffractive optical element 41 which has the shape illustrated in FIG. 3. The aforementioned formulae are not necessarily available. When the diffractive optical element 41 is formed by use of photolithography techniques and etching techniques, the number of processes is increased with an increase of "N" (i.e., the number of steps). Accordingly, "N" is preferred to be relatively small number (e.g., 4, 8, and 16). Besides, in a situation where the optical simulation software using the IFTA method is used to design the diffractive optical element 41, the pitch Λ can be calculated from "N", $\theta_1$, and λ.

The diffractive optical element 41 shown in FIG. 3 exhibits relatively high diffraction efficiency. The grating pattern 31 of the same configuration as that of the diffractive optical element 41 can be fabricated by repeating the photolithography process and the etching process. However, it is required more number of repetition of exposure, development, and etching with the increase of "N", resulting in an increased cost of forming the pattern 31. Further, it is difficult to improve shape accuracy of the grating pattern 31. In contrast, the use of nanoimprint lithography enables to form the grating pattern 31 with relatively high shape accuracy and at low fabrication cost.

Figure 4:
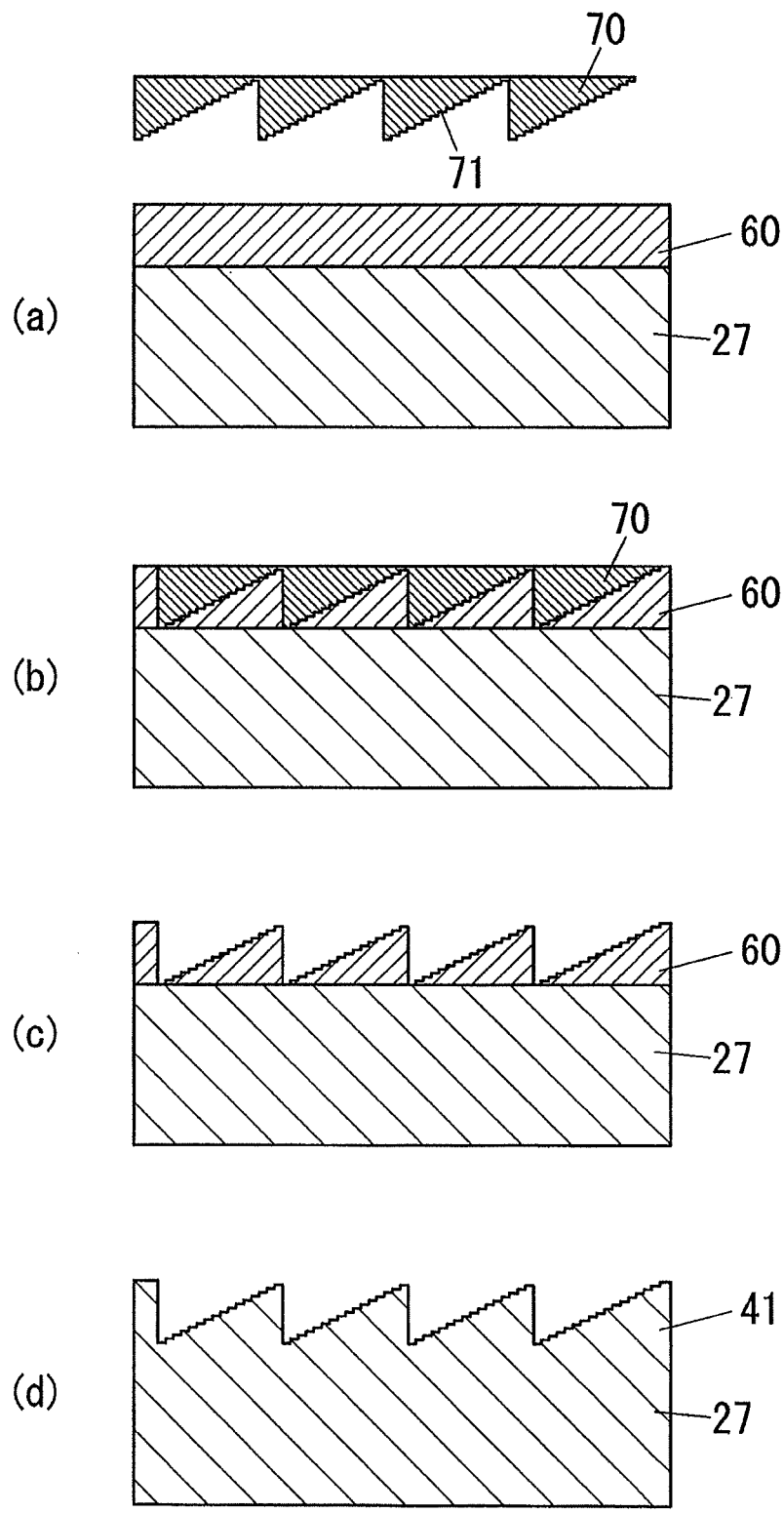
FIG. 4 is a diagram illustrating the method for manufacturing the light emitting device of the first modification.

The following explanation using FIG. 4 is made to a method for forming the grating pattern 31 by use of the nanoimprint lithography.

This method includes a transfer layer forming process and a transfer process.

In the transfer layer forming process, a transfer layer 60 is formed on the second surface of the substrate 27 of the organic EL element 20. For example, a thermoplastic resin (e.g., PMMA) is applied to the second surface of the substrate 27 by use of spin coating. Thereby, the transfer layer 60 is formed.

In the transfer process performed after the transfer layer forming process, a mold 70 is positioned to face the transfer layer 60 (see (a) in FIG. 4). The mold 70 is provided with a convexo-concave pattern 71 designed corresponding to the shape of the diffractive optical element 41. The mold 70 is pressed into the transfer layer 60 under certain pressure (see (b) in FIG. 4). Thereafter, the mold 70 is separated from the transfer layer 60. As a result, the convexo-concave pattern 71 of the mold 70 is transferred to the transfer layer 60 (see (c) in FIG. 4). In other words, in the transfer process, the mold 70 is positioned to face the transfer layer 60. Next, the mold 70 comes into contact with the transfer layer 70 while the transfer layer 60 is heated to be softened. Thereafter, the mold 70 is pressed into the transfer layer 60 under predetermined pressure to deform the transfer layer 60. After the transfer layer 60 is cooled down, the mold 70 is separated from the transfer layer 60. Thus, the convexo-concave pattern defining the diffractive pattern (grating pattern) is provided to the substrate 27 of the organic EL element 20.

In the transfer layer forming process, the transfer layer 60 is heated and cooled. In stead of the transfer layer 60, the mold 70 may be heated and cooled. The nanoimprint lithography is not limited to thermal nanoimprint lithography using the transfer layer 60 made of the thermoplastic resin as mentioned in the above. The nanoimprint lithography may be photo nanoimprint lithography using the transfer layer 60 made of a photo curable resin. In an example adopting the photo nanoimprint lithography, the transfer layer 60 is made of a photo curable resin having low viscosity, and the transfer layer 60 is shaped by use of the mold 70. Thereafter, the transfer layer 60 (the photo curable resin) is irradiated with ultra violet light so as to cause no negative effect on the organic EL element 20. Thereby, the transfer layer 60 becomes solid. Thereafter, the mold 70 is separated from the transfer layer 60.

Besides, with etching the transfer layer 60 and the substrate 27 after the transfer process, the diffractive optical element 41 defining the first grating pattern 311 can be formed. Moreover, the second grating pattern 312 is formed by use of the aforementioned nanoimprint lithography after formation of the first grating pattern 311.

Once after a mold tool is prepared, it is possible to successfully reproduce the optical element 30 of identical configuration (diffractive pattern), even of complex configuration, which enables to fabricate the light emitting device 10 with the diffractive optical element 30 at a reduced cost.

Generally, the substrate 27 of the organic EL element 20 is made of a glass material. Therefore, the substrate 27 inherent to the organic EL element 20 can be used for fabricating the diffractive optical element 30. With fabricating the diffractive optical element 30 by making the use of the substrate 27, the light emitting device 10 can be thinned. In order to fabricate the diffractive optical element 30 without making the use of the substrate 27, transparent members for fabricating the diffractive optical element 30 are necessitated to be adhered to the substrate 27. However, with utilizing the substrate 27 to fabricate the diffractive optical element 30, it is possible to reduce the number of the transparent members.

Besides, when the organic EL element 20 is formed, the grating patterns 31 are preliminarily provided to opposite surfaces of the substrate 27.

The following explanation is made to a method for fabricating the light emitting device 10 shown in FIG. 1. First, the anode layer 21, the hole injecting layer 24, the hole transporting layer 25, the yellow light emitting layer 231, the blue light emitting layer 232, the electron transporting layer 26, and the cathode layer 22 are formed in this order over the first surface of the substrate 27 made of the glass material. Next, the first grating pattern 311 is formed in the second surface of the substrate 27. Thereafter, the transparent member 32 of a glass film is formed on the second surface of the substrate 27 in such a manner as to give a flat finish on the surface of the transparent member 32 remote from the substrate 27. After that, the second grating pattern 312 is formed in the surface of the transparent member 32 remote from the substrate 27.

According to the light emitting device 10 shown in FIG. 1, the substrate 27 and the transparent member 32 constitute the diffractive optical element 30.

The light emitting device 10 of the present embodiment includes the organic EL element 20 and the diffractive optical element 30. The organic EL element 20 includes the anode layer 21, the cathode layer 22, and the plural light emitting layers 230 which are interposed between the anode layer 21 and the cathode layer 22 and are configured to emit light rays having the different wavelengths. The diffractive optical element 30 is located in the paths of the light rays emitted from the organic EL element 20, and acts as a collective lens. The diffractive optical element 30 includes the plural grating patterns 31 diffracting the light rays respectively emitted from the plural light emitting layers 230 for reducing the chromatic aberration.

According to the light emitting device 10, the diffractive optical element 30 controls light distribution to improve light output of the light emitting device 10, and it is possible to reduce the chromatic aberration.

In the light emitting device 10 of the present embodiment, the organic EL element 20 includes the substrate 27 with transparency. The substrate 27 is placed in the paths of the light rays respectively emitted from the plural light emitting layers 230. The anode layer 21, the cathode layer 22, and the plural light emitting layers 230 are stacked on the first surface of the substrate 27. At least one of the plural grating patterns 31 is defined by the second surface of the substrate 27 having grooves periodically arranged thereon.

According to the light emitting device 10 of the present embodiment, the diffractive optical element 30 is fabricated by making the use of the substrate 27 inherent to the organic EL element 20. Thus, there is no need to attach separately formed diffractive optical element 30 to the organic EL element 20. Further, it can be relatively easy to fabricate the diffractive optical element 30 with high shape accuracy.

The following explanation is made to a method for manufacturing the light emitting device 10 shown in FIG. 5. First, the anode layer 21, the hole injecting layer 24, the hole transporting layer 25, the red light emitting layer 233, the green light emitting layer 234, the blue light emitting layer 232, and the cathode layer 22 are formed in this order over the first surface of the substrate 27 made of the glass material. Next, the first grating pattern 311 is formed in the second surface of the substrate 27. Thereafter, the transparent member 32 of a glass film is formed on the second surface of the substrate 27 in such a manner as to give a flat finish on the surface of the transparent member 32 remote from the substrate 27. After that, the second grating pattern 312 is formed in the surface of the transparent member 32 remote from the substrate 27. Further, the transparent member 33 of a glass film is formed on the surface of the transparent member 32 remote from the substrate 27 in such a manner as to give a flat finish on the surface of the transparent member 32 remote from the transparent member 32. After that, the third grating pattern 313 is formed in the surface of the transparent member 33 remote from the transparent member 32.

In the light emitting device 10 shown in FIG. 5, the diffraction effect of the first grating pattern 311 is enhanced with an increase in a difference in the refractive index between the substrate 27 and the transparent member 32. The diffraction effect of the second grating pattern 312 is enhanced with an increase in a difference in the refractive index between the transparent member 32 and the transparent member 33. The diffraction effect of the third grating pattern 313 is enhanced with an increase in a difference in the refractive index between the transparent member 32 and the transparent member 33. Therefore, each of the substrate 27 and the transparent member 33 is preferred to have the refractive index higher than that of the transparent member 32. For example, there is an idea that the substrate 27 and the transparent member 33 are made of a material with relatively high transparency (e.g., a borosilicate glass), and an air layer is adopted as the transparent member 32. In this arrangement, the transparent member 33 is made of the borosilieate glass, for example. The second grating pattern 312 is formed in the surface of the transparent member 33 adjacent to the substrate 27, and the third grating pattern 313 is formed in the surface of the transparent member 33 far from the substrate 27. Thereafter, the transparent member 33 is disposed over the second surface of the substrate to create a space between the substrate 27 and the transparent member 33. In contrary, each of the substrate 27 and the transparent member 33 may have the refractive index lower than that of the transparent member 32.

In the present embodiment, the grating pattern 31 is defined by plural protrusions or grooves which are arranged regularly. The protrusions or grooves constituting the grating pattern 31 may be arranged in the second surface of the substrate 27 of the organic EL element 20 in a concentric fashion. In this arrangement, the protrusions or grooves are formed such that an interval of the protrusions or grooves is made smaller towards a periphery of the second surface than at a center of the second surface.

Second Embodiment

Figure 6:
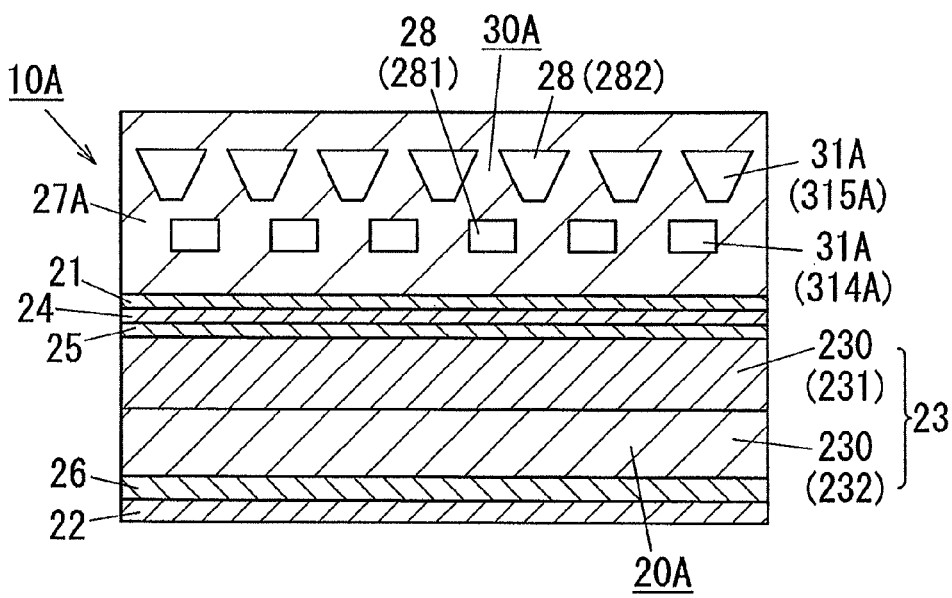
FIG. 6 is a schematic cross sectional diagram illustrating the light emitting device of the second embodiment.
Figure 7:
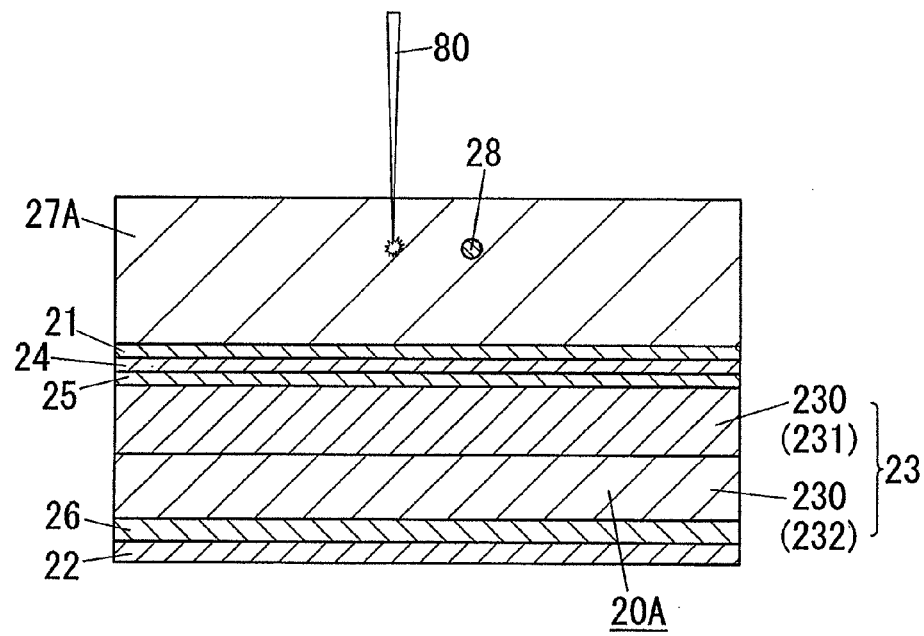
FIG. 7 is a diagram illustrating the method for manufacturing the above light emitting device.

The light emitting device 10A of the present embodiment includes, as shown in FIG. 6, the organic EL element 20A and the diffractive optical element 30A. Besides, components common to the light emitting device 10A of the present embodiment and the light emitting device 10 of the first embodiment are designated by the same reference numerals and no explanations thereof are deemed necessary.

The organic light emitting device 20A includes the anode layer 21, the cathode layer 22, the organic light emitting layer 23, the hole injecting layer 24, the hole transporting layer 25, the electron transporting layer 26, and the substrate 27A.

The substrate 27A is provided in its inside with regions 28 (first regions 281 and second regions 282) each having a different refractive index from that of the substrate 27A. As shown in FIG. 6, each of the first regions 281 is defined by a rectangular cavity formed inside of the substrate 27A closer to the first surface than the second surface of the substrate 27A. Each of the second regions 282 is defined by a cavity of an upside-down trapezoid shape formed inside of the substrate 27A closer to the second surface than the first surface of the substrate 27A. The plural regions 28 are arranged in a plane substantially parallel to the second surface of the substrate 27A.

The diffractive optical element 30A has the plural grating patterns 31A (first grating pattern 314A and second grating pattern 315A). Each of the grating patterns 31A is defined by the plural regions 28 which have a different refractive index from that of the substrate 27A and is formed inside of the substrate 27A at predetermined intervals. In the present embodiment, the region 28 is defined as a cavity. In brief, according to the diffractive optical element 30A, the diffraction of light rays is caused by a difference in a refractive index between a medium defined by the three-dimensionally-formed cavity inside the substrate 27A of the organic EL element 20A and a medium defined by the substrate 27A. Therefore, the diffractive optical element 30A is fabricated by making the use of the substrate 27A. Especially, in the light emitting device 10A shown in FIG. 6, the substrate 27A functions as the diffractive optical element 30A.

Figure 8:
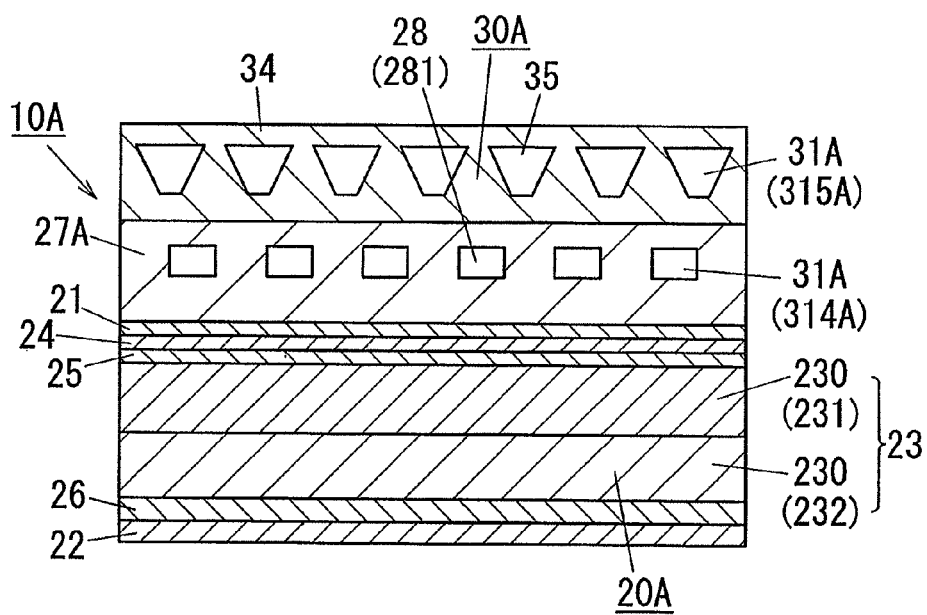
FIG. 8 is a schematic cross sectional diagram illustrating the light emitting device of the modification of the second embodiment.

In the light emitting device 10A shown in FIG. 8, there is a transparent member 34 formed on the second surface of the substrate 27A. The transparent member 34 is made of a material selected from a synthetic silica glass and a borosilicate crown optical glass, for example. In the light emitting device 10A shown in FIG. 8, only the first regions 281 are formed in the inside of the substrate 27A. The transparent member 34 is provided in its inside with regions 35 having a different refractive index from that of the transparent member 34. Each of the regions 35 is defined by a cavity which has an upside-down trapezoid shape formed inside of the transparent member 34. The regions 28 and 35 may be formed in members (substrate 27A and transparent member 34) having different refractive indices, respectively.

In the present embodiment, the grating pattern 31A includes the regions 28 which have a different refractive index from that of the substrate 27A and are formed inside of the substrate 27A at predetermined intervals. In the instance shown in FIG. 6, the region 28 is a cavity (air layer). The region 28 is not limited to a cavity but may be a part of the substrate 27A which is modified to have a refractive index different from that of the substrate 27A.

The region 28 can be formed by irradiating, with a femtosecond pulse laser beam 80 (a pulse width is less or equal to $10^{-12}$ sec), a transparent member (e.g., the substrate 27A made of the glass material) constituting the diffractive optical element 30A. Irradiation of the glass with the pulse laser beam 80 gives extremely high energy having a momentary value not less than 1011 W, and causes a phenomenon referred to as "multiphoton absorption". Consequently, the region 28 is formed in a focal point of the pulse laser beam 80 and a close vicinity (extent of hundreds of nanometers to several micrometers) of the focal point. Using the laser in the aforementioned manner generates no substantial heat when the region 28 is formed. Further, the transparent member other than parts where the regions 28 are formed is not damaged substantially.

The following explanation is made to a method of manufacturing the light emitting device 10A shown in FIG. 6. First, the organic EL element 20A is formed by use of the substrate 27A made of silica. Next, the inside of the substrate 27A is irradiated with the pulse laser beam 80 via the second surface of the substrate 27A of the organic EL element 20 in accordance with the configuration of the first region 281. Thereby, the first regions 281 are formed inside of the substrate 27A. Subsequently, the inside of the substrate 27A is irradiated with the pulse laser beam 80 via the second surface of the substrate 27A in accordance with the configuration of the second region 282. Thereby, the second regions 282 are formed inside of the substrate 27A. Consequently, the light emitting device 10A including the diffractive optical element 30A is obtained.

For example, the substrate 27 is made of silica. The silica has the refractive index of 1.5 for light having a wavelength of about 550 nm. Irradiation with the pulse laser beam 80 having a wavelength of 800 nm, output power of 0.3 W, a pulse frequency of 1 kHz, and a pulse width of 150 fs can form a minute cavity with a diameter of about 400 nm as the region 28.

In order to increase a difference of a refractive index at the grating pattern 31A, it is preferred that the substrate 27A be made of a borosilicate glass having a relatively high refractive index and a cavity filled with air be formed as the region 28.

The region 28 can be formed in a three-dimensional manner by use of the pulse laser beam 80 with adjusting a pulse width, a pulse intensity, and a focal point of the pulse laser beam 80.

In the light emitting device 10A of the present embodiment, the organic EL element 20A includes the substrate 27A with transparency. The substrate 27A is located in the paths of the light rays respectively emitted from the light emitting layers 230. Stacked on the substrate 27A are the anode layer 21, the cathode layer 22, and the plural light emitting layers 230. At least one of the grating patterns 31A is defined by plural regions 28 which are formed inside of the substrate 27A at predetermined intervals and have a different refractive index from that of the substrate 27A.

According to the light emitting device 10A of the present embodiment, the diffractive optical element 30A is fabricated by making the use of the substrate 27A inherent to the organic EL element 20A. Thus, there is no need to attach separately formed diffractive optical element 30A to the organic EL element 20A. Further, it can be relatively easy to form the diffractive optical element (grating pattern 31A) in the substrate 27A with high shape accuracy.

The invention claimed is:

1. A light emitting device comprising:
an organic electroluminescence element including an organic light emitting layer including plural light emitting layers having different dominant emission wavelengths, which are stacked, said organic light emitting layer being configured to emit light rays of said different dominant emission wavelengths through a light emission surface of said organic light emitting layer; and
a diffractive optical element placed over said light emission surface of said organic light emitting layer,
wherein:
said diffractive optical element is designed to have different grating patterns such that the light rays are diffracted by said grating patterns in such a manner to travel in a predetermined direction; and
said different grating patterns comprise diffraction angles different from each other in relation to an incident light ray of a same wavelength.

2. The light emitting device as set forth in claim 1, wherein said organic electroluminescence element comprises:
an anode layer;
a cathode layer; and,
a substrate having a first surface and a second surface, said substrate being placed over said light emission surface of said organic light emitting layer, and said substrate having transparency for the light rays,
said plural light emitting layers interposed between said anode layer and said cathode layer,
said anode layer, said cathode layer, said plural light emitting layers being stacked on said first surface, and
at least one of said grating patterns being defined by said second surface having grooves periodically arranged thereon.

3. The light emitting device as set forth in claim 1, wherein said organic electroluminescence element comprises:
an anode layer;
a cathode layer; and,
a substrate placed over said light emission surface of said organic light emitting layer, said substrate having transparency for the light rays
said plural light emitting layers interposed between said anode layer and said cathode layer, and
at least one of said grating patterns defined by regions which are formed inside of said substrate at predetermined intervals and have a different refractive index from that of said substrate.

4. The light emitting device as set forth in claim 3, wherein each of said regions is a cavity.

5. The light emitting device as set forth in claim 1, wherein one of said different grating patterns is a serrated grating pattern having a serration shape in cross-section, each serration of said serrated grating pattern having a plurality of levels, said serrated grating pattern being formed according to:

a depth L being represented by a formula $$L = \frac{15\lambda}{16(n_1 - 1)}$$

wherein a dominant wavelength of said light ray is $\lambda$, and a refractive index of a material of said at least one serrated grating pattern is $n_1$; and
a pitch per pixel being represented by a formula $$\Lambda = N \times \lambda \times \sin\theta_1$$

wherein $\theta_1$ is said diffraction angle, N is a number of levels, $N \sin\theta_1$ is much greater than 1.

6. The light emitting device as set forth in claim 5, wherein said serrated grating pattern is optimized based on parameters selected from the group consisting of light intensity distributions of said organic electroluminescence element, dimensions of said different grating patterns, the number of levels N, a size of an irradiation area, location of the irradiation area, and output intensity distribution.

7. A light emitting device comprising:
an organic electroluminescence element including an organic light emitting layer including plural light emitting layers having different dominant emission wavelengths, which are stacked, said organic light emitting layer being configured to emit light rays of said different dominant emission wavelengths through a light emission surface of said organic light emitting layer; and
a diffractive optical element placed over said light emission surface of said organic light emitting layer,
wherein
said diffractive optical element is designed to have different grating patterns diffracting the light rays for reducing color unevenness; and
said different grating patterns comprise diffraction angles different from each other in relation to an incident light ray of a same wavelength.

8. The light emitting device as set forth in claim 7, wherein said organic electroluminescence element comprises:
an anode layer;
a cathode layer; and,
a substrate having a first surface and a second surface, said substrate being placed over said light emission surface of said organic light emitting layer and said substrate having transparency for the light rays,
said plural light emitting layers interposed between said anode layer and said cathode layer,
said anode layer, said cathode layer, said plural light emitting layers being stacked on said first surface, and
at least one of said grating patterns being defined by said second surface having grooves periodically arranged thereon.

9. The light emitting device as set forth in claim 7, wherein said organic electroluminescence element comprises:
an anode layer;
a cathode layer; and,
a substrate placed over said light emission surface of said organic light emitting layer, said substrate having transparency for the light rays,
said plural light emitting layers interposed between said anode layer and said cathode layer, and
at least one of said grating patterns defined by regions which are formed inside of said substrate at predetermined intervals and have a different refractive index from that of said substrate.

10. The light emitting device as set forth in claim 9, wherein each of said regions is a cavity.

11. The light emitting device as set forth in claim 7, wherein
one of said different grating patterns is a serrated grating pattern having a serration shape in cross-section, each serration of said serrated grating pattern having a plurality of levels, said serrated grating pattern being formed according to:
a depth L being represented by a formula $$L = \frac{15\lambda}{16(n_1 - 1)}$$

wherein a dominant wavelength of said light ray is $\lambda$, and a refractive index of a material of said at least one serrated grating pattern is $n_1$; and
a pitch per pixel being represented by a formula $\Lambda = N \times \lambda \times \sin\theta_1$ wherein $\theta_1$ is said diffraction angle, N is a number of levels, $N \sin\theta_1$ is much greater than 1.

12. The light emitting device as set forth in claim 11, wherein said serrated grating pattern is optimized based on parameters selected from the group consisting of light intensity distributions of said organic electroluminescence element, dimensions of said different grating patterns, the number of levels N, a size of an irradiation area, location of the irradiation area, and output intensity distribution.

13. A light emitting device comprising:
an organic electroluminescence element including an organic light emitting layer including plural light emitting layers having different dominant emission wavelengths, which are stacked, said organic light emitting layer being configured to emit light rays of said different dominant emission wavelengths through a light emission surface of said organic light emitting layer; and
a diffractive optical element placed over said light emission surface of said organic light emitting layer,
wherein
said diffractive optical element is designed to have different grating patterns diffracting the light rays for reducing wavelength dependency of the light rays; and
said different grating patterns comprise diffraction angles different from each other in relation to an incident light ray of a same wavelength.

14. The light emitting device as set forth in claim 13, wherein
said organic electroluminescence element comprises:
an anode layer;
a cathode layer; and,
a substrate having a first surface and a second surface, said substrate being placed over said light emission surface of said organic light emitting layer, and said substrate having transparency for the light rays,
said plural light emitting layers interposed between said anode layer and said cathode layer,
said anode layer, said cathode layer, said plural light emitting layers being stacked on said first surface, and
at least one of said grating patterns being defined by said second surface having grooves periodically arranged thereon.

15. The light emitting device as set forth in claim 13, wherein
said organic electroluminescence element comprises:
an anode layer;
a cathode layer; and,
a substrate placed over said light emission surface of said organic light emitting layer said substrate having transparency for the light rays, and
said plural light emitting layers interposed between said anode layer and said cathode layer, and
at least one of said grating patterns defined by regions which are formed inside of said substrate at predetermined intervals and have a different refractive index from that of said substrate.

16. The light emitting device as set forth in claim 15, wherein each of said regions is a cavity.

17. The light emitting device as set forth in claim 13, wherein
one of said different grating patterns is a serrated grating pattern having a serration shape in cross-section, each serration of said serrated grating pattern having a plurality of levels, said serrated grating pattern being formed according to:
a depth L being represented by a formula $$L = \frac{15\lambda}{16(n_1 - 1)}$$

wherein a dominant wavelength of said light ray is $\lambda$, and a refractive index of a material of said at least one serrated grating pattern is $n_1$; and
a pitch per pixel being represented by a formula $\Lambda = N \times \lambda \times \sin\theta_1$ wherein $\theta_1$ is said diffraction angle, N is a number of levels, $N \sin\theta_1$ is much greater than 1.

18. The light emitting device as set forth in claim 17, wherein said serrated grating pattern is optimized based on parameters selected from the group consisting of light intensity distributions of said organic electroluminescence element, dimensions of said different grating patterns, the number of levels N, a size of an irradiation area, location of the irradiation area, and output intensity distribution.

19. A light emitting device comprising:
an organic electroluminescence element including an organic light emitting layer including plural light emitting layers having different dominant emission wavelengths, which are stacked, said organic light emitting layer being configured to emit light rays of said different dominant emission wavelengths through a light emission surface of said organic light emitting layer; and
a diffractive optical element placed over said light emission surface of said organic light emitting layer,
wherein
said diffractive optical element is designed to have different grating patterns diffracting the light rays for making spatial phase distribution of each of the light rays uniform; and
said different grating patterns comprise diffraction angles different from each other in relation to an incident light ray of a same wavelength.

20. The light emitting device as set forth in claim 19, wherein
said organic electroluminescence element comprises:
an anode layer;
a cathode layer; and,
a substrate having a first surface and a second surface, said substrate being placed over said light emission surface of said organic light emitting layer, and said substrate having transparency for the light rays, said plural light emitting layers interposed between said anode layer and said cathode layer, said anode layer, said cathode layer, said plural light emitting layers being stacked on said first surface, and at least one of said grating patterns being defined by said second surface having grooves periodically arranged thereon.

21. The light emitting device as set forth in claim 19, wherein said organic electroluminescence element comprises:

an anode layer;

a cathode layer; and, a substrate placed over said light emission surface of said organic light emitting layer, said substrate having transparency for the light rays, said plural light emitting layers interposed between said anode layer and said cathode layer, and at least one of said grating patterns defined by regions which are formed inside of said substrate at predetermined intervals and have a different refractive index from that of said substrate.

22. The light emitting device as set forth in claim 21, wherein each of said regions is a cavity.

23. The light emitting device as set forth in claim 19, wherein one of said different grating patterns is a serrated grating pattern having a serration shape in cross-section, each serration of said serrated grating pattern having a plurality of levels, said serrated grating pattern being formed according to:

a depth L being represented by a formula $$L = \frac{15\lambda}{16(n_1 - 1)}$$

wherein a dominant wavelength of said light ray is $\lambda$, and a refractive index of a material of said at least one serrated grating pattern is $n_1$; and a pitch per pixel being represented by a formula $$\Lambda = N \times \lambda \times \sin\theta_1$$

wherein $\theta_1$ is said diffraction angle, N is a number of levels, $N \sin\theta_1$ is much greater than 1.

24. The light emitting device as set forth in claim 23, wherein said serrated grating pattern is optimized based on parameters selected from the group consisting of light intensity distributions of said organic electroluminescence element, dimensions of said different grating patterns, the number of levels N, a size of an irradiation area, location of the irradiation area, and output intensity distribution.

\* \* \* \* \*